United States Patent
Chatterjee et al.

(10) Patent No.: US 7,598,507 B2
(45) Date of Patent: Oct. 6, 2009

(54) ADJUSTABLE LITHOGRAPHY BLOCKING DEVICE AND METHOD

(75) Inventors: Basab Chatterjee, Allen, TX (US); Richard L. Guldi, Dallas, TX (US); Keith W. Melcher, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1450 days.

(21) Appl. No.: 10/459,681

(22) Filed: Jun. 11, 2003

(65) Prior Publication Data

US 2004/0251429 A1 Dec. 16, 2004

(51) Int. Cl.
G03B 27/52 (2006.01)
G03B 27/42 (2006.01)
G03B 27/58 (2006.01)

(52) U.S. Cl. ............... 250/504 R; 250/492.1; 250/492.2; 250/492.3; 355/30; 355/53; 355/72; 355/77

(58) Field of Classification Search ............. 250/492.2, 250/492.22, 492.3, 492.23; 355/53
See application file for complete search history.

(56) References Cited

U.S. PATENT DOCUMENTS

| 5,041,361 A | * | 8/1991 | Tsuo | 430/311 |
| 6,341,007 B1 | * | 1/2002 | Nishi et al. | 355/53 |
| 6,342,941 B1 | * | 1/2002 | Nei et al. | 355/52 |

* cited by examiner

*Primary Examiner*—David A Vanore
(74) *Attorney, Agent, or Firm*—Wade J. Brady, III; Frederick J. Telecky, Jr.

(57) ABSTRACT

The present invention provides, in one embodiment, a method (100) of manufacturing a semiconductor device. A conventionally formed reticle is positioned over a resist located on a substrate (110). A radiation path through the reticle and a window assembly located between a radiation source and resist (120), is considered. It is determined whether or not the radiation would expose a predefined blocking area of the resist within the exposure zone (130). If the radiation would expose a blocking area, then the window assembly is configured to prevent radiation from exposing the blocking area in the exposure zone (140). Other embodiments include a window assembly (300) and system (400) to facilitate manufacturing of the semiconductor device according to the method (100).

12 Claims, 5 Drawing Sheets

ADJUSTABLE LITHOGRAPHY BLOCKING DEVICE AND METHOD

TECHNICAL FIELD OF THE INVENTION

The present invention is directed in general to the manufacture of semiconductor devices, and, more specifically, to manufacturing semiconductor devices using an adjustable lithography blocking device and method.

BACKGROUND OF THE INVENTION

It is desirable to produce as large a yield of semiconductor devices per wafer in as short a time as possible. To increase the speed of device manufacture, the layout for several integrated circuit (IC) chips is formed at the same time. Typically, a reticle having a grid of several layouts is stepped or scanned across the entire surface of the wafer while radiation is passed through the reticle to a resist layer on the wafer. The fabrication of IC chips in the perimeter regions of the wafer using this approach is problematic, however.

There are limitations in the focusing ability of lithography equipment and topographic variations in the outer annulus region of the wafer at the wafer edge. This results in the production of poorly-defined vias and trench features in certain IC chips located near or at the annulus. In addition, metal deposition procedures in the annulus region are not as uniform as for the interior portions of the wafer. Consequently, lithographic printing and etching of patterns and deposition of conductive lines in the annulus region can result in the production of partially completed device features.

The partially completed device features can serve as particle traps for debris produced during the electrode chemical deposition (ECD) of metals and chemical mechanical polishing (CMP). Moreover, the debris can dislodge and contaminate semiconductor devices being fabricated on interior portions of the wafer, thereby reducing device yields. In a similar fashion, portions of the partially completed device features can peel off during subsequent processing steps and contaminate other portion of the wafer.

To reduce these problems, the printing and etching of device features into the wafer is followed by several remedial procedures to mitigate the undesirable consequence of producing the partially completed device features. These remedial procedures themselves, however, have undesirable side effects. Consider, for example, wafer edge exclusion (WEE), one procedure typically used to reduce wafer contamination from the above-described partially complete features. Typically a wafer is exposed to lithographic printing and etching as discussed above, followed by the WEE process. The WEE process involves exposing a band of resist located on the perimeter of the wafer to form a trench. The trench is filled with a metal to prevent waste material from becoming lodged in the trench and contaminating other portions of the wafer. The resulting metal band, however, can cause electrical arcing during subsequent processing steps. In addition, vias deposited over the metal band are prone to peeling.

To reduce the deleterious side effects associated with the WEE process, an edge bead removal (EBR) procedure, such as chemical etching, is applied to take off the metal band. Typically, however, there is a slight spatial mismatch between the positioning of metal remaining in the outer trench after the WEE process, and the regions of metal taken off during the EBR procedure. An excessive EBR spatial mismatch can result in the undesirable formation of open trenches. Alternatively, a misaligned EBR can leave a residual metal band, with problems ensuing similar to that discussed above. To reduce problems remaining after WEE and EBR, a further procedure to blade off corner chips is done. The blade-off procedure, however, reduces the yield of IC chips because it undesirably blocks the production of all IC chips around the perimeter of the wafer.

Accordingly, what is needed in the art is a flexible low cost method to avoid printing undesired patterns at the wafer's edge, while not introducing additional problems into semiconductor device manufacturing processes.

SUMMARY OF THE INVENTION

To address the above-discussed deficiencies of the prior art, one embodiment is directed to a method of manufacturing a semiconductor device. The method includes positioning a reticle having device patterns formed therein over a resist located on a substrate. The device patterns define an exposure zone of the resist. The method also includes considering a radiation pathway through the reticle and a window assembly located between a radiation source and the resist. The method further comprises adjusting an exposure width of the window assembly to prevent the radiation from exposing a predefined blocking area of said resist within the exposure zone.

Another embodiment provides a window assembly for forming lithographic layouts of device patterns. The window assembly has a slit configured to pass radiation from a radiation source through a reticle and onto a resist layer on a substrate. The window assemble thereby exposes device patterns in the resist layer, the device patterns defining an exposure zone. The window assembly also includes one or more shutters configured to adjust a width of the slit. At least one motor is coupled to the shutter to move the shutter. The window assembly further includes a controller configured to send a signal to the motor to adjust a position of the shutter to prevent the radiation from exposing a blocking area within the exposure zone.

Yet another embodiment is a system for manufacturing a semiconductor device. The system comprises a reticle having device patterns formed therein that define an exposure zone. The reticle is positionable over a resist layer located on a substrate. The system further includes a radiation source and a window assembly. The window assembly is located between the radiation source and the resist. The window assembly is configured to be adjusted to an exposure width to prevent radiation from the radiation source from exposing a predefined blocking area of the resist within the exposure zone.

The foregoing has outlined preferred and alternative features of the present invention so that those of ordinary skill in the art may better understand the detailed description of the invention that follows. Additional features of the invention described hereinafter can also form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Certain embodiments of the present invention employ an improved method, device or system to facilitate the lithographic manufacturing of a semiconductor device. As well know, lithographic manufacturing processes are used to fabricate devices, such as integrated circuit devices, optical devices, micro-electromechanical (MEMS) devices, etc. . . . In lithographic manufacturing processes, a pattern is defined and developed in an energy sensitive material known as a resist. The pattern is then used as an etch mask to transfer the pattern into a layer of material underlying the resist. The underlying layer of material is referred to generically as a substrate. One skilled in the art will appreciate that, in device fabrication, the pattern is typically transferred into a layer of material formed over a bulk substrate.

In certain embodiments of the prevent invention, a window assembly is configured to block a radiation from exposing a resist on a substrate at certain predefined blocking areas. Blocking areas are defined as those areas of the resist where it is undesirable to transfer device patterns onto. A predefined blocking areas can be a location on the resist where undesirable partially formed device features could be formed if exposed to radiation, for example. Because it is more likely that partially completed features would be formed in the perimeter region of the wafer, blocking areas are often located around the edges of the substrate. However, it should be understood that other embodiments might provide for blocking areas to be on an interior portion of the wafer.

By preventing radiation exposure, trenches are not formed and metal features are not deposited in the blocking areas. Therefore, partially completed device features, that likely would have been formed in these areas, do not contaminate other portions of the wafer substrate. Therefore, the speed of device production is increased because the need to perform multi-step remedial procedures to remove partially completed features is eliminated. In addition, the yield of functional semiconductor devices produced per wafer is improved.

Figure 1:
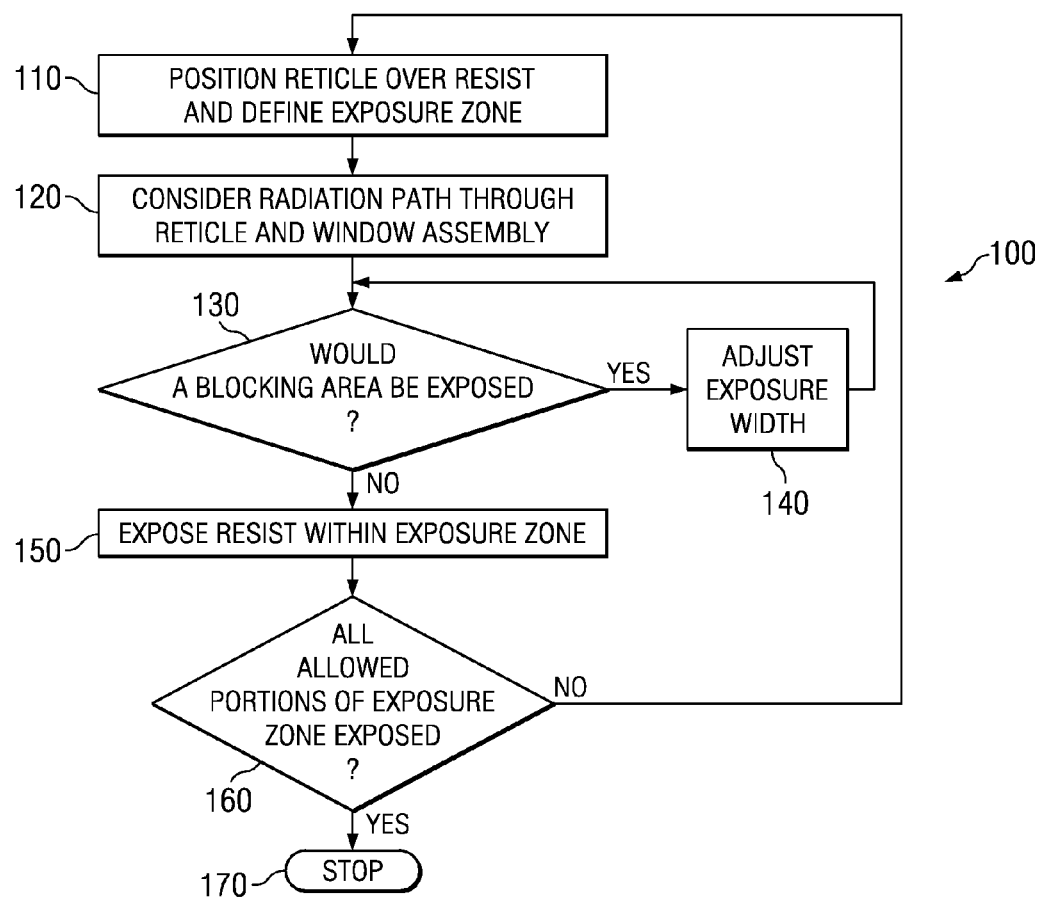
FIG. 1 illustrates by flow diagram, selected steps in a method of manufacturing a semiconductor device.

One embodiment of the present invention is a method of manufacturing a semiconductor device. FIG. 1 illustrates, by flow diagram, selected steps in an embodiment of the method 100. In step 110, a conventionally formed reticle is positioned over a resist located on a substrate. The reticle has one or more device patterns formed therein. In some embodiments, the reticle has several device patterns arranged as grid, for example. In certain embodiments, each semiconductor device pattern defines a layout for one layer of an IC chip. The arrangement of device patterns in the reticle defines an exposure zone.

In step 120, the radiation path through the reticle and a window assembly located between a radiation source and resist is considered. In step 130, it is determined whether or not the radiation would expose a predefined blocking area of the resist within the exposure zone. If the radiation would expose a blocking area, then the window assembly is configured to prevent radiation from exposing the blocking area in the exposure zone, for example, by adjusting an exposure width of the window assembly, in step 140.

If the radiation would not expose a blocking area, then the radiation is transmitted through the window assembly and reticle to expose the resist within the exposure zone to radiation, in step 150. In certain preferred embodiments, the device pattern of the entire reticle is transferred to the resist in the exposure zone by moving one or more of the reticles, window assembly or substrate relative to the radiation. In some instances, exposure occurs prior to adjusting the exposure width of the window assembly, while in other instances, exposing is subsequent to adjusting the exposure width.

If it is decided, in step 160, that all portions of the exposure zone not designed as blocking areas have been exposed to the radiation, then the reticle is repositioned over a different portion of the resist, in step 110. Thus, a new exposure zone is defined and exposed to radiation, as described in steps 120 to 150. The method 100 is stopped, at step 170, after all portions of the resist on the substrate that are not designated as blocking areas are exposed.

Figure 2A:
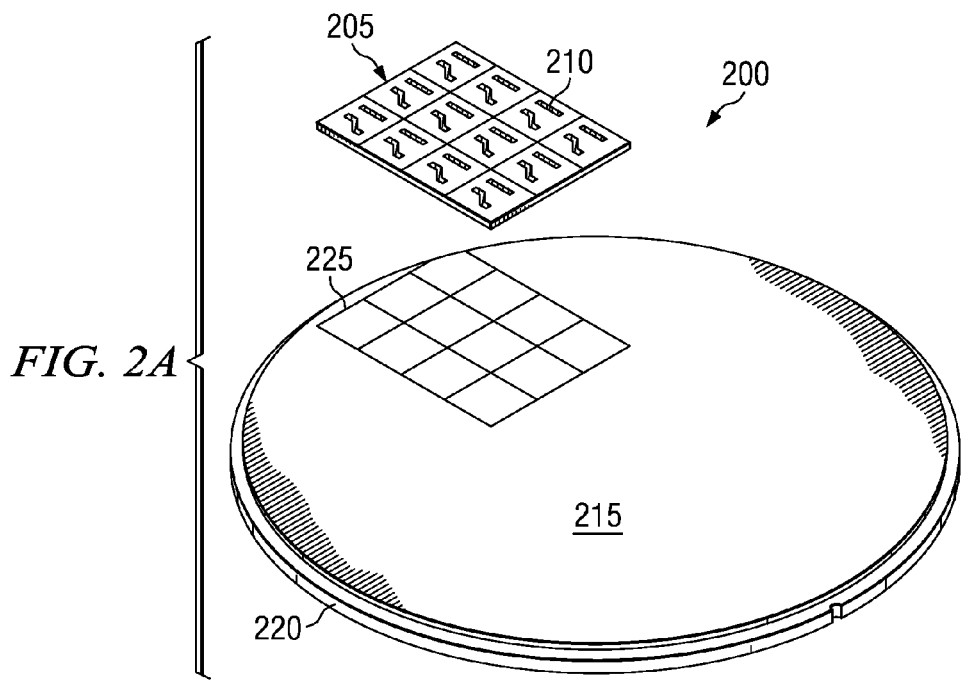
FIGS. 2A to 2D illustrate perspective views of selected steps in a method of manufacturing a semiconductor device.

FIGS. 2A to 2D illustrate perspective views of selected steps of an exemplary embodiment of the method of manufacturing a semiconductor device 200. Turning to FIG. 2A, the method includes positioning a reticle 205 having device patterns 210 formed therein over a resist 215 located on a substrate 220. In the embodiment depicted, the reticle 205 has a 4 by 3 grid of device patterns 210 that defines an exposure zone 225 on the resist 215.

The substrate 220 can comprise any conventional material used in semiconductor device fabrication. The substrate 220 can further include other conventional materials, such as oxide and metal layers, used in the manufacture of semiconductor devices. For instance, in certain preferred embodiments, the substrate 220 is a silicon wafer. In some preferred embodiments, the resist 215 is a layer formed over a surface of the wafer. A resist layer can be formed using conventional techniques, such as spin coating a conventional photoresist material over the substrate 220. The resist material may be any energy sensitive material that can be patterned upon exposure to a radiation 230. Multiple layers can be formed under or over the resist 215, each layer defining different patterned features in a multi-leveled semiconductor device comprising an IC, for example.

Figure 2B:
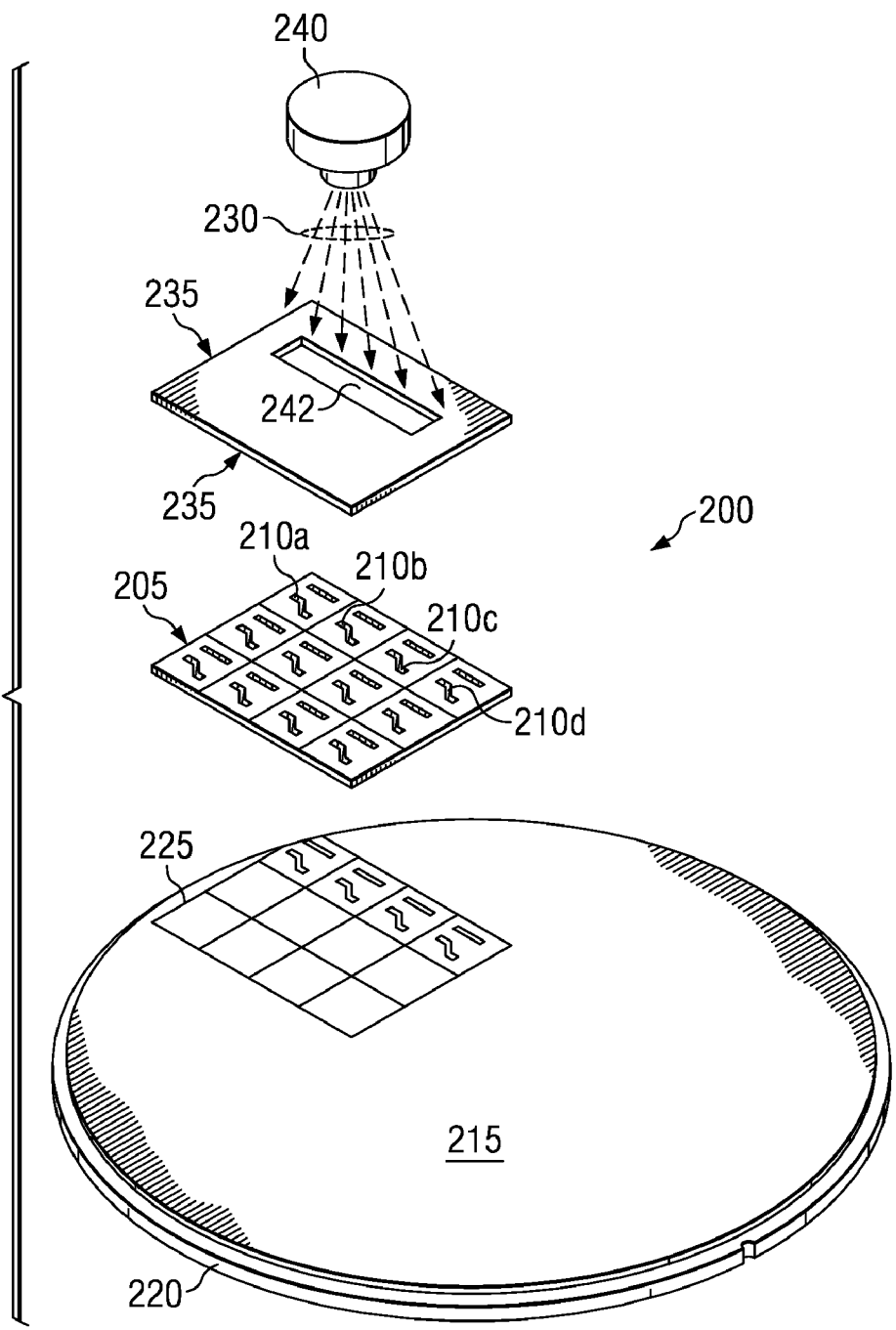

As illustrated in FIG. 2B, the method further includes passing radiation 230 through the reticle 205 and a window assembly 235 located between a conventional radiation source 240 and the resist 215. The radiation 230 can be any form of radiation, such as visible light, ultraviolet light, x-ray, ion beam, or electron beam radiation, that can be used in lithographic processes. In certain preferred embodiments, as shown in FIG. 2B, the reticle 205 is coupled to the window assembly 235 such that the radiation 230 passes through the reticle 205 before passing through the window assembly 235. In other embodiments, however, the radiation 230 passes through the window assembly 235 before passing through the reticle 205.

To speed device fabrication, it is preferable to simultaneously pass the radiation 230 through a plurality of the semiconductor device patterns 210a, 210b, 210c and 210d in the reticle 205. Consider the reticle 205 having the four by three matrix of semiconductor device patterns 210 depicted in FIG. 2B. In certain instances, radiation 230 is allowed to pass through an opening 242 of the window assembly 235 such that portions of four semiconductor device patterns 210a, 210b, 210c, 210d along the same horizontal dimension are simultaneously exposed to the radiation 230.

Figure 2C:
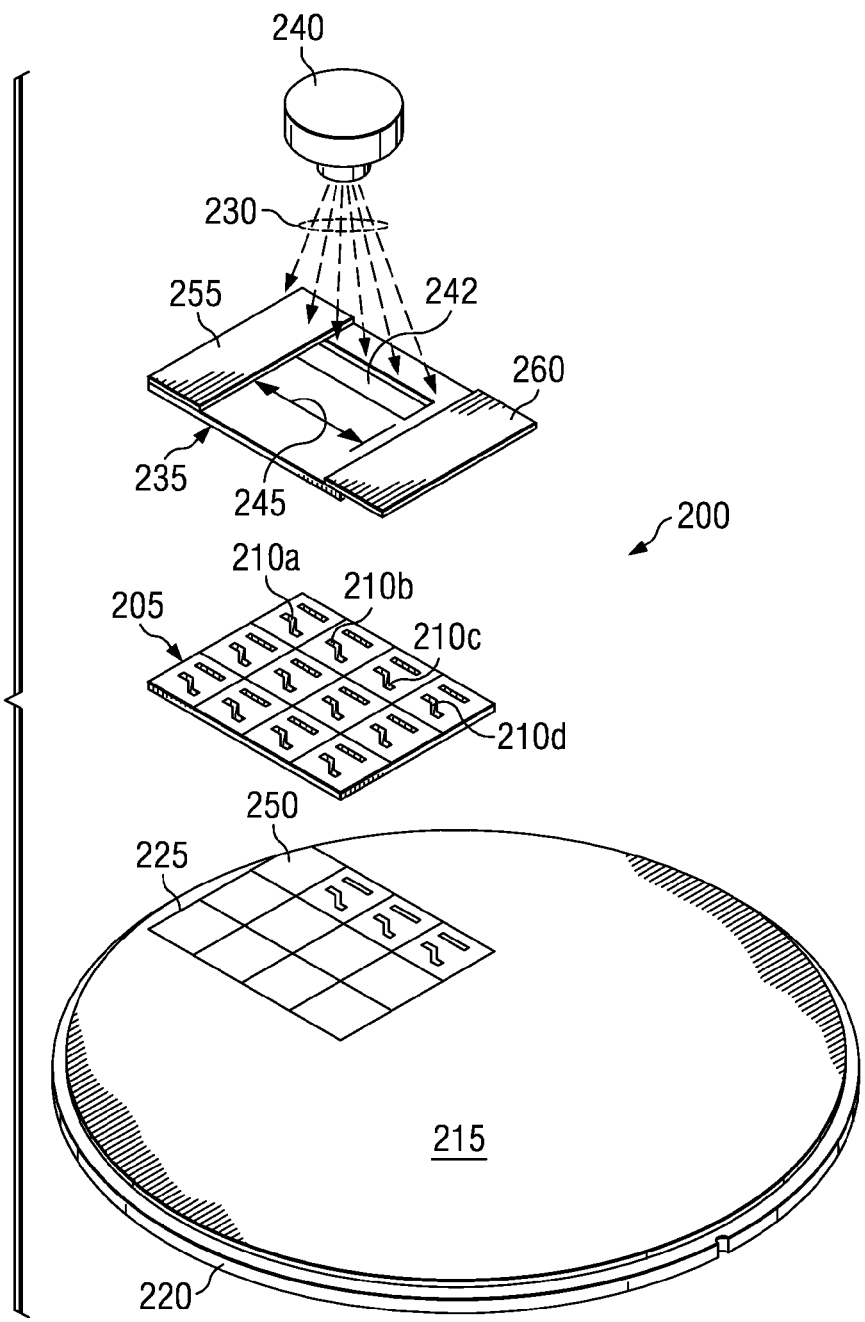

In other instances, however, it is desirable not to expose certain portions of the resist 215 within the exposure zone 225. As illustrated in FIG. 2C, the method also includes adjusting an exposure width 245 of the window assembly 235 to prevent the radiation 230 from exposing a predefined blocking area 250 of the resist 215 within the exposure zone 225. To facilitate adjusting the exposure width 245, in certain preferred embodiments, the window assembly 235 has one or more shutters 255, 260. In some embodiments, adjusting includes moving at least one these shutters 255, 260 to prevent the radiation 230 from passing through the window assembly 235 and exposing the resist 215 located over the blocking area 250. Alternatively, adjusting can include moving two opposing shutters 255, 260 to prevent the radiation 230 from passing through the window assembly 235 and exposing the resist 215 located over the blocking area 250. In certain preferred embodiments the shutters 255, 260 are configured to move independently of each other, although the shutters 255, 260 can be moved in a coordinated fashion, if desired.

For instance, consider a scenario where it is decided that one device pattern 210a in the reticle 205, if transferred to the resist 215, would be undesirably close to the edge of the substrate 220. In such instances, the corresponding portion of the resist 215 would be designated as the blocking area 250. As such, one or both of the shutters 255, 260 is moved to change the exposure width 245. This, in turn, would prevent the radiation 230 from exposing the predefined blocking area 250 in the exposure zone 225.

In some embodiments, the predefined blocking area 250 may be substantially equal to an area corresponding to one of the device patterns 210a. In other embodiments, however, different sized blocking areas 250 could be defined, if desired. Methods well known to those skilled in the art may be used to identify the blocking area 250. In certain cases, the blocking area 250 is identified based on empirical information. In trial runs, the entire resist 215 on the substrate 220 is exposed by passing radiation through the reticle 205 as described above. The resist 215 is then examined to identify locations where partial device features 210a are formed. In other cases, the blocking area 250 is identified based on simulations of the predicted layout of device patterns 210 in the resist 215. The predict layout is examined to identify the likely locations of partially formed device features 210a.

Certain preferred embodiments of the method, include adjusting the exposure width 245 by moving one or more of the shutters 255, 260 as a function of the window assembly's 235 location above the substrate 220. In certain embodiments, for example, when the window assembly's 235 location is above an exposure zone 225 having a predefined blocking area 250, one or both of the shutters 255, 260 of the window assembly 235 is or are moved so that the radiation 230 will not expose the blocking area 250. In certain preferred embodiments, one or more of the shutters 255, 260, can be programmed to move to a predefined position, based of the window assembly's 235 location above the substrate 220.

Figure 2D:
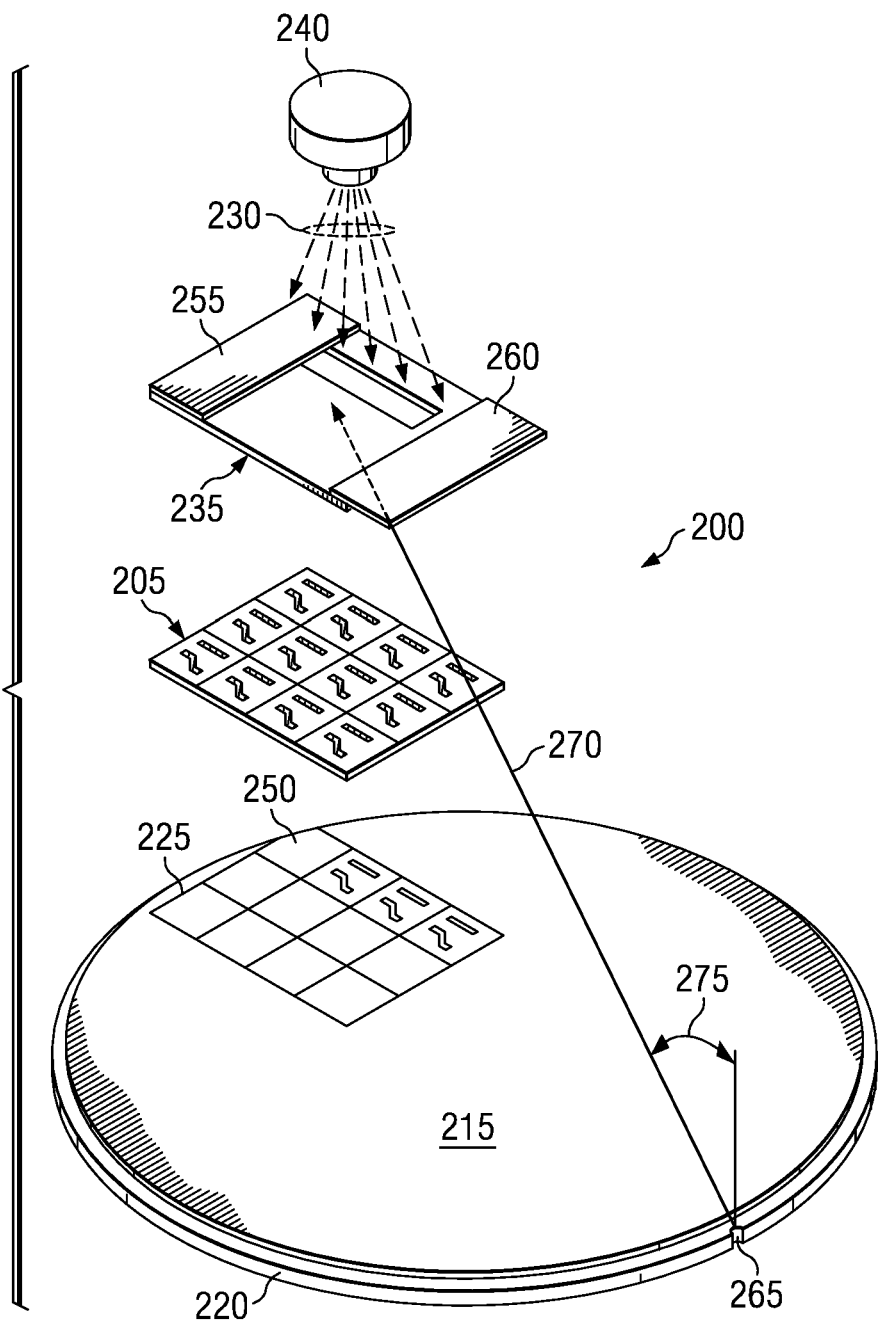

In certain preferred embodiments, such as that depicted in FIG. 2D, the window assembly's 235 location above the substrate 220 is used to control the resist's 215 exposure to radiation 230. In certain embodiments, the window assembly's 235 location is defined by Cartesian or polar coordinates relative to a marker 265 on the substrate 220. For example, as that depicted in FIG. 2D, the window assembly's 235 location is defined by a radial distance 270 and angle 275 of the window assembly 235 relative to the marker 265. In other embodiments, however, the window assembly's 235 location is defined by a pair of abscissa and ordinate coordinates relative to the marker 265. In certain embodiments, the marker 265 is a notch that is formed near an edge of the substrate 220, such as that depicted in FIG. 2D. Other regions, such as the center of the substrate 220, could also serve as the marker 265, if desired.

As well understood by those skilled in the art, the marker 265 can serve to orient the reticle's 205 location above the substrate 220, such that the exposure zones 225 are in substantially the same location from one substrate 220 to another. Markers 265 thus facilitate the formation of semiconductor device patterns in substantially identical locations in the resist 215 of different substrates 220.

The marker 265 can similarly help to ensure that device features do not get formed in predefined blocking areas 250 of the resist 215 on different substrates 220. Thus, in some preferred embodiments, the substrate 220 is a semiconductor wafer 220 having a marker 265 thereon. The marker orients window assembly's 235 location above the semiconductor wafer 220, such that a location of the predefined blocking area 250 on the semiconductor wafer 220 is in substantially the same location on a different semiconductor wafer having substantially the same shape as the semiconductor wafer 220 depicted in FIG. 2D.

Figure 3:
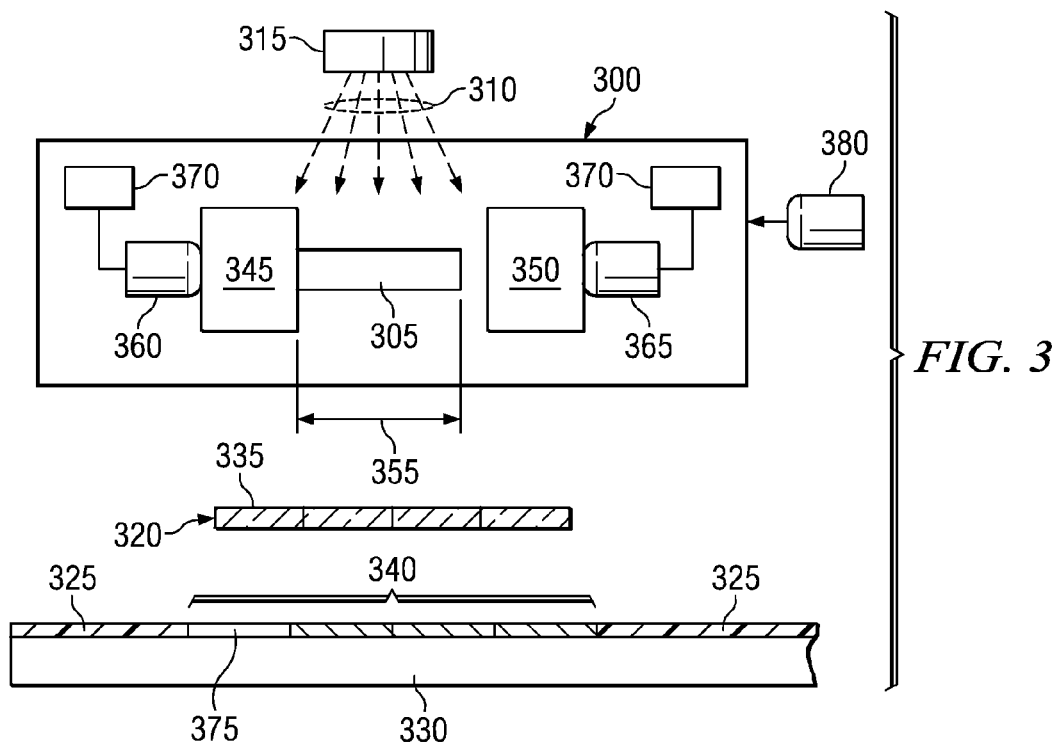
FIG. 3 illustrates a sectional view of a window assembly for forming lithographic layouts of device patterns.

Another embodiment of the present invention includes a window assembly for forming lithographic layouts of device patterns. FIG. 3 presents a cross sectional view of one embodiment of the window assembly 300. The window assembly 300 may employ any of the embodiments of the window assembly that were discussed in the context of the method of manufacturing a semiconductor device in FIGS. 1 and 2 and accompanying text. The window assemble 300 includes a slit 305 configured to pass radiation 310 from a radiation source 315 through a reticle 320 and onto a resist 325 on a substrate 330. As previously discussed, the radiation 310 exposes the resist 325 through the transfers device patterns 335 formed in the reticle 320 thereby defining an exposure zone 340 in the resist 325.

The window assembly 300 also comprises one or more shutters 345, 350 configured to adjust a width 355 of the slit 305. The window assembly 300 further includes at least one motor 360, 365 coupled to the one or more shutters 345, 350 to move the one or more shutters 345, 350. It should be noted from the outset of this discussion that the various mechanical aspects of the window assembly 300 are shown very schematically because one skilled in the art of manufacturing such windows would understand how to mechanically configure the window assembly 300 and shutters 345, 350 to operate in the desirable manner. Any conventional motor conducive to high precision positioning applications may be used. In certain preferred embodiments, for example, the motor 360, 365 is a linear motor configured to producing a force sufficient to move the shutters 345, 350 to a designated position. The motor(s) 360, 365 may be mechanically coupled to the shutters 345, 350 in a number of ways. For example, the shutters 345, 350 may be coupled to the motor(s) 360, 365 by a linear magnetic, ball screw or similar driving mechanism.

The window assembly 300 also includes one or more controller 370 configured to send a signal to the motors 360, 365 to adjust a position of the shutters 345, 350 to prevent the radiation 310 from exposing a blocking area 375 within the exposure zone 340. It certain preferred embodiments, for example, the signal is sent as a function of the slit's 305 location above the substrate 330, as discussed above. In still other preferred embodiments, the slit's 305 location is controlled by a conventional stepper assembly 380 configured to move the window assembly 300 across the substrate 330.

Figure 4:
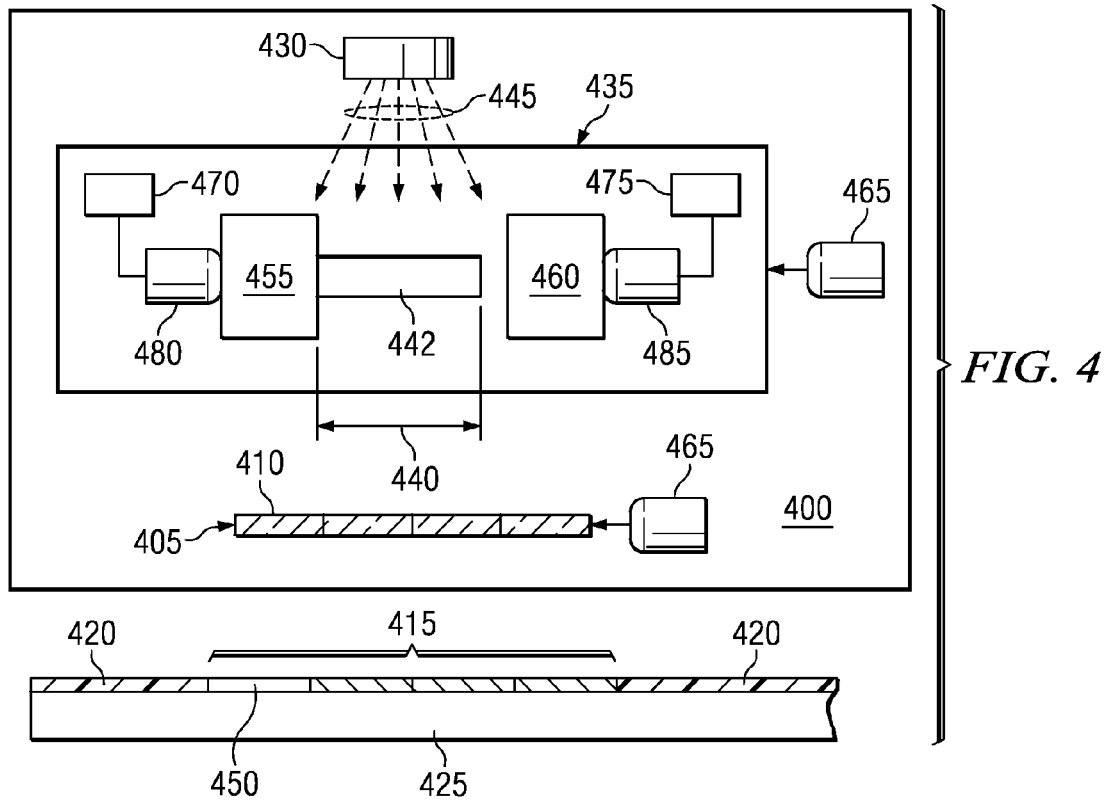
FIG. 4 presents a block diagram of a system for manufacturing a semiconductor device.

Yet another embodiment of the present in invention is a system for manufacturing a semiconductor device. Any of the above-discussed embodiments of the method of manufacturing the semiconductor or the window assembly and other components may be incorporated into the system. A block diagram of one embodiment of the system 400 is illustrated in FIG. 4.

The system 400 includes a reticle 405 having device patterns 410 formed therein that define an exposure zone 415 of a resist 420. The reticle 405 is positionable over the resist 420 located on a substrate 425. The system 400 further includes a radiation source 430 and a window assembly 435. The window assembly 435 is located between the radiation source 430 and the resist 420. The window assembly 435 is configured to be adjusted to an exposure width 440 of an opening 442 to prevent radiation 445 from the radiation source 430 from exposing a predefined blocking area 450 of the resist 420 within the exposure zone 415. In certain preferred embodiments of the system 400, the radiation source 430 is configured to pass the radiation 445 through the reticle 405 and the window assembly 435.

In certain preferred embodiments of the system 400, the window assembly 435 includes one or more shutters 455, 460 configured to control an amount of the radiation 445 exposing the resist 420. In still other preferred embodiments, the system 400 further includes one or more stepper motors 465 coupled to the window assembly 435 and the reticle 405. The stepper motors 465 are configured to transport the window assembly 435 and the reticle 405 to a predefined location above the substrate 435.

Certain preferred embodiments of the window assembly 435 include one or more controllers 470, 475 configured to move the shutters 455, 460 to a predefined position as a function of the predefined location that the window assembly 435 and the reticle 405 are transported to. In certain embodiments, window assembly 435 includes one or more motors 480, 485 configured to move the shutters 455, 460 upon receiving a signal from the controllers 470, 475. In some preferred embodiments, the stepper motors 465 are further configured to halt movement of the window assembly 435 so as to allow said one or more shutters 455, 460 to reach a predefined position before the resist 420 is exposed to the radiation 445. Of course, as discussed above, in other instances exposing the resist occurs prior to adjusting the window assembly 435.

In certain preferred embodiments, the controllers 470, 475, further include one or more computers having program instructions that control the positioning of the shutters 455, 460 to their respective predefined positions as described above. In certain embodiments, the program instructions are stored in a computer readable media comprising any computer storage tools including but not limited to hard disks, CDs, floppy disks, and memory or firmware. In such embodiments, the program instructions are configured to cause the one or more computers of the controllers 470, 475 to execute program code instructions that cause the controller to position the shutters 455, 460.

Although the present invention has been described in detail, one of ordinary skill in the art should understand that they can make various changes, substitutions and alterations herein without departing from the scope of the invention.

What is claimed is:

1. A method of manufacturing a semiconductor device, comprising:
   providing a resist layer over a substrate;
   defining a blocking region on said substrate where said overlying resist layer will not be exposed;
   providing a reticle having device patterns formed therein wherein said device patterns define an exposure zone;
   providing a radiation source and a window assembly wherein said window assembly is located between said radiation source and said resist;
   positioning said reticle between said radiation source and said resist wherein said exposure zone of said reticle is at least partially over said blocking region; and
   adjusting an exposure width of said window assembly to prevent radiation from said radiation source from exposing said blocking region wherein adjusting includes moving one or more shutters of said window assembly as a function of said window assembly's location above said substrate.

2. The method as recited in claim 1, further including exposing a portion of said resist to said radiation within said exposure zone.

3. The method as recited in claim 2 wherein said exposing includes exposing prior to said adjusting.

4. The method as recited in claim 2 wherein said exposing includes exposing subsequent to said adjusting.

5. The method as recited in claim 1, wherein said location is defined by a radial distance and an angle from said window assembly to a marker on said substrate.

6. A system for manufacturing a semiconductor device, comprising:
   a reticle having device patterns formed therein that define an exposure zone, said reticle positionable over a resist layer formed over a substrate;
   a radiation source;
   a window assembly located between said radiation source and said resist layer, said window assembly configured to be adjusted to an exposure width to prevent radiation from said radiation source from exposing portions of said resist layer within said exposure zone and overlying a predefined blocking area of said substrate; and
   said window assembly includes one or more controllers configured to move said one or more shutters to a predefined position as a function of said predefined location.

7. The system as recited in claim 6, wherein said radiation source is configured to pass said radiation through said reticle and said window assembly.

8. The system as recited in claim 6, wherein said window assembly includes one or more shutters configured to control an amount of said radiation exposing said resist.

9. The system as recited in claim 8, further including one or more stepper motors coupled to said window assembly and said reticle and configured to transport said window assembly and said reticle to a predefined location above said substrate.

10. The system as recited in claim 9, wherein said window assembly includes one or more motors configured to move said one or more shutters upon receiving a signal from said one or more controllers.

11. The system as recited in claim 9, wherein said one or more stepper motors are further configured to halt movement of said window assembly so to allow said one or more shutters to reach a predefined position before said exposing.

12. The system as recited in claim 6, wherein said exposing occurs prior to said adjusting.

* * * * *